(12) United States Patent
Murata

(10) Patent No.: US 7,566,575 B2
(45) Date of Patent: Jul. 28, 2009

(54) MOUNTING CIRCUIT AND METHOD FOR PRODUCING SEMICONDUCTOR-CHIP-MOUNTING CIRCUIT

(75) Inventor: Shinji Murata, Fukushima (JP)

(73) Assignee: ALPS Electric Co., Ltd., Tokyo (JP)

( * ) Notice: Subject to any disclaimer, the term of this patent is extended or adjusted under 35 U.S.C. 154(b) by 199 days.

(21) Appl. No.: 11/888,121

(22) Filed: Jul. 30, 2007

(65) Prior Publication Data

US 2008/0057600 A1 Mar. 6, 2008

(30) Foreign Application Priority Data

Sep. 4, 2006 (JP) ............................. 2006-238976

(51) Int. Cl.
*H01L 21/4763* (2006.01)

(52) U.S. Cl. ...................... 438/15; 438/17; 438/108; 438/113; 438/116; 257/531; 257/759; 257/778; 257/782; 257/783; 257/E21.503; 257/E21.508; 257/E21.509; 257/E21.519; 257/E21.525; 257/E23.021; 257/E23.022; 257/E23.068; 257/E23.146; 257/E25.011; 257/E25.029

(58) Field of Classification Search ............... 438/14, 438/15–17, 108–116; 257/277, 531, 759, 257/778, 782, 783, E21.503, 507–511, 519, 257/525, E23.021–E23.024, E23.068, E23.078, 257/146, E25.011, E25.029

See application file for complete search history.

(56) References Cited

U.S. PATENT DOCUMENTS

| | | | | |
|---|---|---|---|---|
| 6,077,380 | A * | 6/2000 | Hayes et al. | 156/283 |
| 6,336,269 | B1 * | 1/2002 | Eldridge et al. | 29/885 |
| 6,392,524 | B1 * | 5/2002 | Biegelsen et al. | 336/200 |
| 6,948,940 | B2 * | 9/2005 | Lindsey et al. | 439/66 |
| 7,102,367 | B2 | 9/2006 | Yamagishi et al. | |
| 7,143,500 | B2 | 12/2006 | Byrd | |
| 7,470,927 | B2 * | 12/2008 | Lee et al. | 174/524 |
| 2007/0108551 | A1 * | 5/2007 | Lin | 257/531 |

FOREIGN PATENT DOCUMENTS

JP 2005-050598 2/2005

* cited by examiner

*Primary Examiner*—Michael S Lebentritt
(74) *Attorney, Agent, or Firm*—Beyer Law Group LLP

(57) ABSTRACT

A method according to the present invention for producing a semiconductor-chip-mounting circuit 1 includes mainly three steps. In a first step, contacts 2 each in the form of a conical helix are formed by solder-plating the surface of connecting terminals 12 on a mounting circuit 10. In a second step, a continuity test is performed by pressing bumps 21 against the contacts 2. In a final third step, the contacts 2 pressed are melted to connect the connecting terminals 12 to the bumps 21. That is, the semiconductor chip 20 is connected to the mounting circuit 10 while maintaining a state in which they pass the continuity test, thereby significantly reducing the occurrence of defective continuity in the semiconductor-chip-mounting circuit 1.

12 Claims, 5 Drawing Sheets

MOUNTING CIRCUIT AND METHOD FOR PRODUCING SEMICONDUCTOR-CHIP-MOUNTING CIRCUIT

CLAIM OF PRIORITY

This application claims benefit of the Japanese Patent Application No. 2006-238976 filed on Sep. 4, 2006, which is hereby incorporated by reference.

BACKGROUND OF THE INVENTION

1. Field of the Invention

The present invention relates to a mounting circuit and a method for producing a semiconductor-chip-mounting circuit. In particular, the present invention relates to a mounting circuit and a method for producing a semiconductor-chip-mounting circuit obtained by solder-bonding of a connecting terminal of a mounting circuit to a bump of a semiconductor chip.

2. Description of the Related Art

In production processes of semiconductor chips, such as integrated circuits (ICs) and large scale integrations (LSIs: ICs having a degree of integration of 1,000 to 10,000), continuity tests are performed by connecting semiconductor chips to test jigs, such as probe cards, thereby reducing waste in which defective semiconductor chips are mounted on mounting circuits.

In probe cards used in performing continuity tests for ball grid array (BGA) semiconductor chips or land grid array (LGA) semiconductor chips, contacts (probes) that are each in the form of a conical helix are connected to surfaces of connecting terminals arranged at a narrow pitch of several tens of micrometers on each probe card in order to bring the contacts into contact with either many globular each having an external diameter of several tens of micrometers or many land bumps each having a width of several tens of micrometers and arranged at a narrow pitch of several tens of micrometers on each semiconductor chip.

When the contacts are pressed against the bumps, the elastic force of the contacts is applied to the bumps. As a result, the semiconductor chips are electrically connected to the probe cards. Thereby, continuity tests for semiconductor chips can be performed without the connection of semiconductor chips with probe cards (see Japanese Unexamined Patent Application Publication No. 2005-50598).

In the case where semiconductor chips are mounted on mounting circuits, desired semiconductor chip are produced, continuity tests are performed for the semiconductor chips before the semiconductor chips are mounted on the mounting circuits, and only the semiconductor chips passed the continuity tests are mounted on the mounting circuits. In other words, hitherto, a semiconductor-chip-mounting circuit obtained by mounting a semiconductor chip on a mounting circuit has been produced through a step of producing the semiconductor chip, an inspection step of the semiconductor chip, and a step of mounting the semiconductor chip.

Even in the case where after a continuity test is performed, a semiconductor chip is connected to a mounting circuit to produce a semiconductor-chip-mounting circuit, if the mounting circuit is defective, or if the connection is defective, defective continuity in the semiconductor-chip-mounting circuit is caused. The semiconductor chip bonded by soldering cannot be removed from the semiconductor-chip-mounting circuit. Thus, disadvantageously, the semiconductor-chip-mounting circuit having defective continuity cannot be reused and must be discarded.

In the early stage of the development of a semiconductor-chip-mounting circuit, the semiconductor chip has a design defect, in some cases. Therefore, even when the semiconductor chip is mounted on a mounting circuit to produce a semiconductor-chip-mounting circuit after the semiconductor chip and the mounting circuit are separately subjected to a continuity test, disadvantageously, defective continuity may occur in the stage of the production of the semiconductor-chip-mounting circuit.

When only a single semiconductor chip is mounted on a semiconductor-chip-mounting circuit, the probability of the occurrence of the defective continuity in the semiconductor-chip-mounting circuit is low, and production costs thereof are not very high. In the case of a large-density semiconductor-chip-mounting circuit including many semiconductor chips, however, the probability of the occurrence of the defective continuity in the semiconductor-chip-mounting circuit is increased as the number of semiconductor chips mounted is increased. Furthermore, production costs of the semiconductor-chip-mounting circuit is increased as the number of semiconductor chips mounted is increased. Thus, even if a small number of semiconductor-chip-mounting circuit is discarded, loss due to disposal may be large.

In recent years, mounting circuits on which semiconductor chips are mounted are not limited to common, inexpensive rigid circuit boards or flexible wiring circuit boards by development of mounting techniques such as chip on glass (COG), chip on chip (COC), and chip on parts (COP). That is, expensive circuits, such as transparent glass substrates used for liquid crystal displays (LCDs), semiconductor chips, and electronic components, may be used as mounting circuits. In particular, costs of the transparent glass substrates used for LCDs are increased as sizes of screens are increased. Thus, a state in which defective continuity occurs in the stage of the production of the liquid crystal displays (semiconductor-chip-mounting circuits) and in which the liquid crystal displays must be discarded is avoided as far as possible.

SUMMARY OF THE INVENTION

The present invention has been made in consideration of these viewpoints. The present invention provides a method for producing a semiconductor-chip-mounting circuit, the method preventing the occurrence of defective continuity in a semiconductor-chip-mounting circuit obtained by mounting a semiconductor chip on a mounting circuit.

Furthermore, the present invention provides a mounting circuit with which a continuity test can be performed without a test jig such as a probe card and with which a continuity test for a semiconductor-chip-mounting circuit can be performed before a semiconductor chip is mounted on the mounting circuit.

A method according to an embodiment for producing a semiconductor-chip-mounting circuit includes a step A of forming a contact on a surface of a connecting terminal disposed on a mounting circuit, the contact being composed of solder and being in the form of a conical helix or a polygonal pyramidal helix; a step B of pressing a bump disposed on a semiconductor chip against the contact; after pressing the bump against the contact, a step C of applying a test voltage to an interconnection pattern formed in the mounting circuit so as to perform a continuity test for the semiconductor chip and the mounting circuit; when the continuity test in the step C demonstrates that the semiconductor chip or the mounting circuit operates abnormally, a step D of replacing the semiconductor chip or the mounting circuit with new one and either performing the step B and the subsequent steps when the semiconductor chip is replaced or performing the step A and the subsequent steps when the mounting circuit is replaced; and only when the continuity test in the step C demonstrates that the semiconductor chip and the mounting circuit operate normally, a step E of melting the contact so as to bond the bump to the connecting terminal.

In the method according to the embodiment for producing a semiconductor-chip-mounting circuit, a continuity test is performed for a semiconductor chip with a mounting circuit on which the semiconductor chip will be mounted. After non-defective continuity is ensured, the semiconductor chip is mounted on the mounting circuit while maintaining the state in which the continuity test is performed, thereby reducing the number of semiconductor-chip-mounting circuits that must be discarded due to defective continuity, loss due to disposal, and industrial waste.

Furthermore, in the method according to the embodiment for producing a semiconductor-chip-mounting circuit, steps of attaching and detaching a test jig such as a probe card to and from a semiconductor chip or a mounting circuit are eliminated, thereby simplifying a production process.

According to another embodiment of the method for producing a semiconductor-chip-mounting circuit, in the method according to the above-described embodiment for producing a semiconductor-chip-mounting circuit, the mounting circuit includes a solder resist film surrounding the connecting terminal, the solder resist film having low solder wettability.

In this case, molten solder is collected on the surface of the connecting terminal without outflow, thereby preventing the lack of the amount of solder when the bump is bonded to the connecting terminal.

According to another embodiment of the method for producing a semiconductor-chip-mounting circuit, in the method according to any one of above-described embodiments for producing a semiconductor-chip-mounting circuit, the connecting terminal includes a connecting terminal base and a contact-assisting film, and the contact-assisting film is formed by solder-plating a surface of the connecting terminal base.

In this case, the contact-assisting film is also melted when the contact is melted. Thus, controlling the thickness of the contact-assisting film prevents the lack of the amount of solder required for the connection of the bump with the connecting terminal.

According to another embodiment of the method for producing a semiconductor-chip-mounting circuit, in the method according to any one of the above-described embodiments for producing a semiconductor-chip-mounting circuit, before the step B, a step F of forming antioxidant films on surfaces of the contact and the bump, each of the antioxidant films being composed of an oxidation-resistant metal.

In this case, even when a burn-in test is performed, the formation of non-conductive oxide films on the surfaces of the bump and the contact is prevented. Thus, the bump is surely connected to the connecting terminal even under burn-in test environment.

According to another embodiment of the method for producing a semiconductor-chip-mounting circuit, in the method according to the above-described embodiment for producing a semiconductor-chip-mounting circuit, the antioxidant film is formed by Au-plating the surface of the contact.

In this case, the antioxidant film having satisfactory oxidation resistance and conductivity is formed. In particular, since the contact is formed by solder plating, a large elastic force is difficult to exert. However, the antioxidant film has satisfactory conductivity, thus surely establishing continuity between the bump and the contact even in the case of a small elastic force applied to the bump.

According to another embodiment of the method for producing a semiconductor-chip-mounting circuit, in the method according to any one of the above-described embodiments for producing a semiconductor-chip-mounting circuit, the solder is composed of a Sn—Ag alloy.

In this case, the absence of lead that adversely affects the human body results in the production of the semiconductor-chip-mounting circuit having a less effect on the human body.

A mounting circuit according to an embodiment includes connecting terminals arranged on a surface of an insulating substrate and having a pitch equal to that of bumps disposed on a semiconductor chip; and contacts arranged on surfaces of the connecting terminals, each of the contacts being composed of solder and being in the form of a conical helix or a polygonal pyramidal helix.

In this case, the spring solder contacts are formed on the connecting terminals. Thus, it is possible to perform a continuity test for a semiconductor chip with the mounting circuit on which the semiconductor chip will be mounted and perform a continuity test for a semiconductor-chip-mounting circuit before mounting the semiconductor chip.

According to another embodiment of the mounting circuit, in the mounting circuit according to the above-described embodiment, the insulating substrate includes a solder resist film disposed on a surface thereof, the solder resist film having low solder wettability and surrounding each connecting terminal.

In this case, the solder resist film surrounds each connecting terminal. Thus, solder is collected on the surface of each connecting terminal without outflow when soldering is performed, thereby preventing the lack of the amount of solder required for the connection of the bumps and the connecting terminals.

According to another embodiment of the mounting circuit, in the mounting circuit according to any one of the above-described embodiments, each of the connecting terminals includes a connecting terminal base and a contact-assisting film, and the contact-assisting film is formed by solder-plating a surface of the connecting terminal base.

In this case, each contact-assisting film is also melted when each contact is melted. Thus, controlling the thickness of each contact-assisting film prevents the lack of the amount of solder required for the connection of the bumps with the connecting terminals.

According to another embodiment of the mounting circuit, in the mounting circuit according to any one of the above-described embodiments, the mounting circuit further includes antioxidant films each composed of an oxidation-resistant metal and arranged on the surface of each contact.

In this case, even when a burn-in test is performed, the formation of non-conductive oxide films on the surfaces of the bumps and the contacts is prevented. Thus, the bumps are surely connected to the connecting terminals even under burn-in test environment.

According to another embodiment of the mounting circuit, in the mounting circuit according to the above-described embodiment, the antioxidant films are formed by Au-plating the surfaces of the contacts.

In this case, the antioxidant films having satisfactory oxidation resistance and conductivity are formed. In particular, since each contact is formed by solder plating, a large elastic force is difficult to exert. However, the antioxidant films have satisfactory conductivity, thus surely establishing continuity between the bumps and the contacts even in the case of a small elastic force applied to each bump.

According to another embodiment of the mounting circuit, in the mounting circuit according to any one of the above-described embodiments, the solder is composed of a Sn—Ag alloy.

In this case, the absence of lead that adversely affects the human body results in the production of the semiconductor-chip-mounting circuit having a less effect on the human body.

DESCRIPTION OF THE PREFERRED EMBODIMENTS

Figure 1:
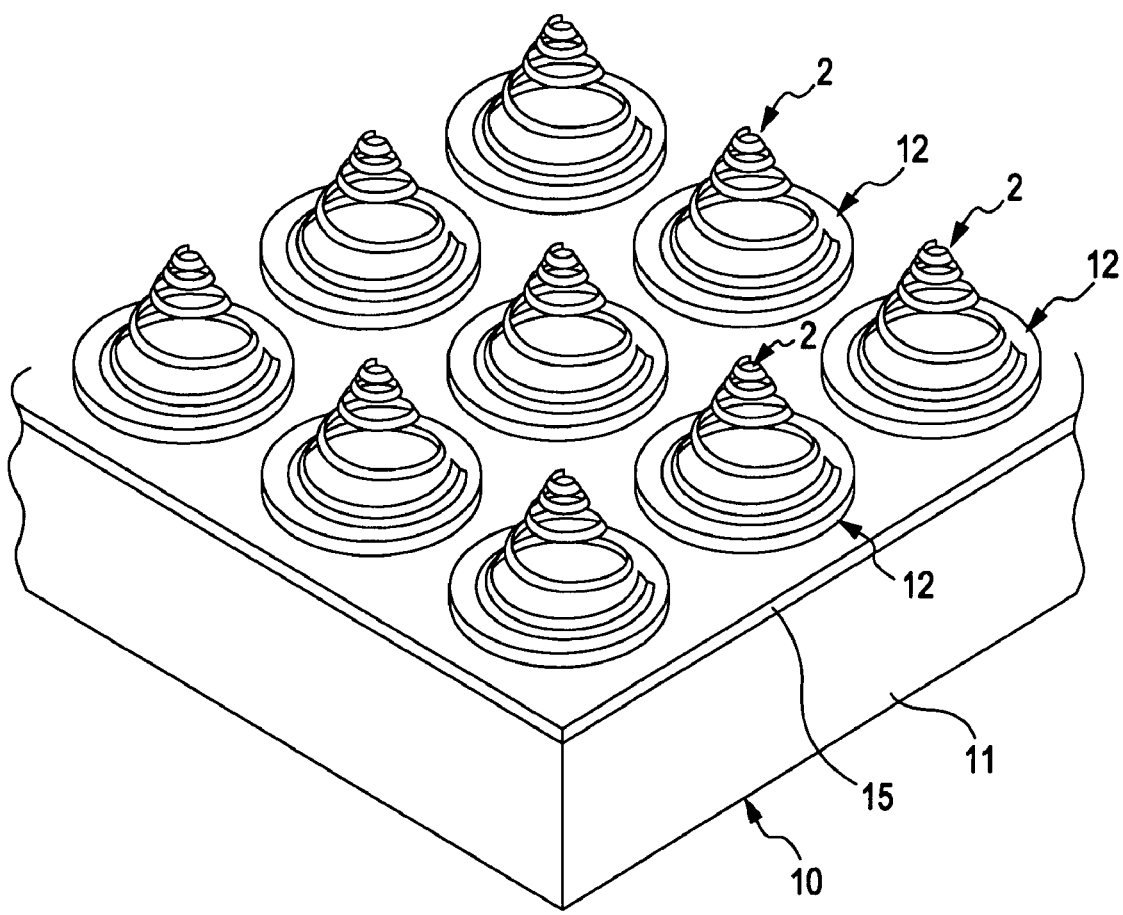
FIG. 1 is a perspective view of a mounting circuit according to an embodiment.
Figure 2:
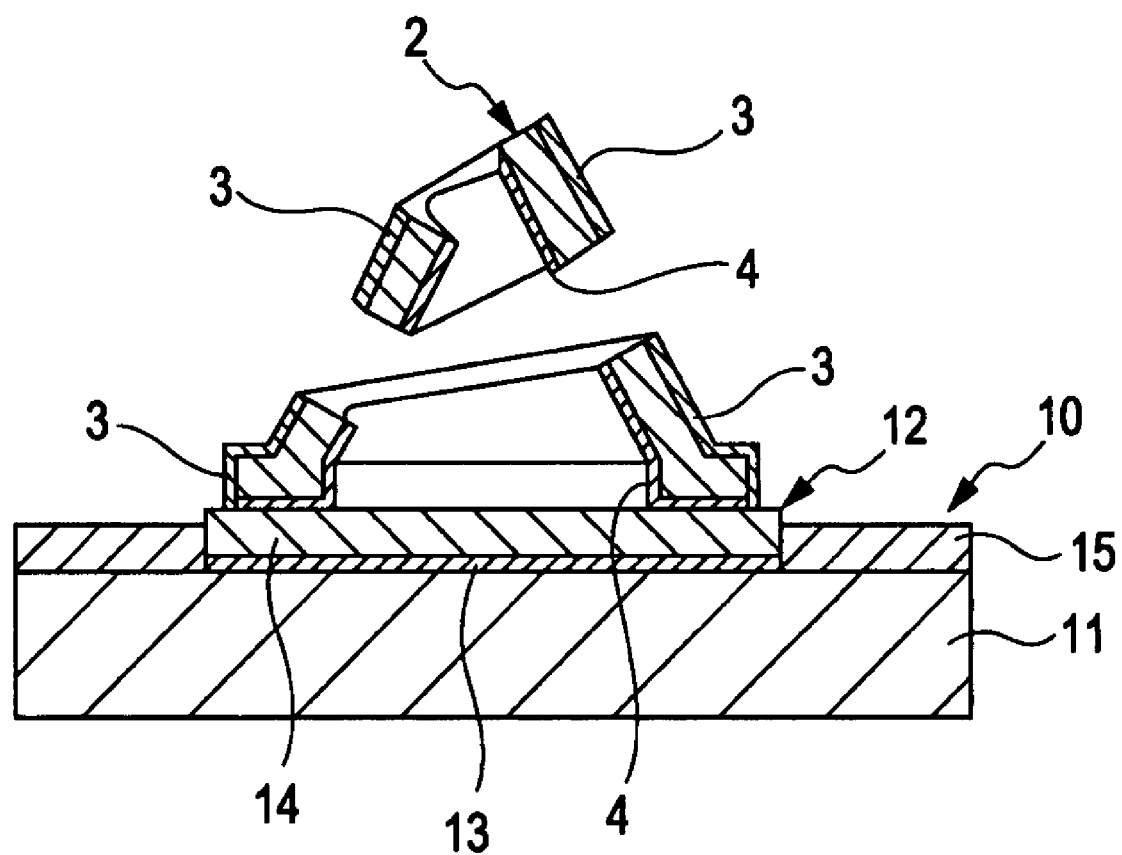
FIG. 2 is a longitudinal sectional view of a mounting circuit according to an embodiment.

A mounting circuit and a method for producing a semiconductor-chip-mounting circuit according to embodiments of the present invention will be described below with reference to FIGS. 1 to 5. FIG. 1 is a perspective view of a mounting circuit 10 according to an embodiment. FIG. 2 is a longitudinal sectional view of the mounting circuit 10 according to this embodiment.

The mounting circuit 10 according to the embodiment is a circuit on which a semiconductor chip, such as a rigid circuit board, a flexible circuit board, a transparent glass substrate used for a LCD, a semiconductor chip, or an electronic component, is mounted. As shown in FIG. 1, the mounting circuit includes an interconnection pattern (not shown) on an insulating substrate 11 having a shape suitable for a target application and connecting terminals 12. The mounting circuit 10 further includes contacts 2 arranged on the surfaces of the connecting terminals 12.

As shown in FIG. 2, each of the connecting terminals 12 includes a connecting terminal base 13 and a contact-assisting film 14. The connecting terminal bases 13 are each composed of a good conductor metal, such as Cu, Ag, or Au. The connecting terminal bases 13 are arranged so as to have a pitch equal to that of globular or land bumps 21 (see FIGS. 4A and 4B) arranged on a semiconductor chip. The connecting terminal bases 13 are electrically connected to the interconnection pattern. Furthermore, as show in FIGS. 1 and 2, the connecting terminal bases 13 according to this embodiment each have a circular shape with an external diameter comparable or larger than that of each contact 2, in view of shapes of the contacts 2.

As shown in FIG. 2, the contact-assisting films 14 are formed by solder-plating the surfaces of the connecting terminal bases 13. The solder constituting the contact-assisting films 14 is preferably the same as that constituting the contacts 2.

The contact-assisting films 14 each have a thickness of about 5 μm to 15 μm. Preferably, the thickness of each contact-assisting film 14 according to this embodiment is appropriately changed in response to the total amount of solder used for the connecting terminals 12 and the contact-assisting films 14. For example, when a small amount of solder used for the contacts 2 is used because the contacts 2 are small, an increase in the thickness of each contact-assisting film 14 increases the amount of solder used for the contact-assisting films 14. When a large amount of solder used for the contacts 2 is used because the contacts 2 are large, a reduction in the thickness of each contact-assisting film 14 reduces the amount of solder used for the contact-assisting films 14. Thus, when the contacts 2 are sufficiently large in view of the amount of solder, the contact-assisting films 14 need not be formed.

In the mounting circuit 10 according to this embodiment, solder resist film 15 surrounds each of the connecting terminals 12, the solder resist film 15 being composed of a resist material having low solder wettability.

As shown in FIGS. 1 and 2, the contacts 2 formed on the surfaces of the connecting terminals 12 are each composed of solder and in the form of a conical helix. The external diameter of the circle of the bottom of each contact is comparable to or slightly smaller than the external diameter of each circular connecting terminal 12. The contacts 2 are formed by solder plating. The thickness is about 10 μm. Solder used for the contacts 2 is preferably a Sn—Ag alloy, such as a Sn—Ag—Cu alloy, a Sn—Ag—Bi alloy, or Sn—Ag—Cu—Bi alloy.

As shown in FIG. 2, an antioxidant film 3 is formed on the surface of each contact 2, the antioxidant film 3 being composed of an oxidation-resistant metal, such as Au, Pt, or Pd. To improve conductivity, the antioxidant film 3 according to this embodiment is formed by Au-plating on the surface of each contact 2. The antioxidant film 3 has a thickness of about 0.3 μm.

When a semiconductor chip 20 is mounted on the mounting circuit 10, the mounting circuit 10 serves as a component of a semiconductor-chip-mounting circuit 1. That is, the semiconductor-chip-mounting circuit 1 according to this embodiment is produced with the semiconductor chip 20 and the mounting circuit 10 according to this embodiment. A method for producing the semiconductor-chip-mounting circuit 1 according to this embodiment mainly includes five steps of, in sequence, a step A (including a step F), a step B, a step C, a step D, and a step E.

Figure 3A:
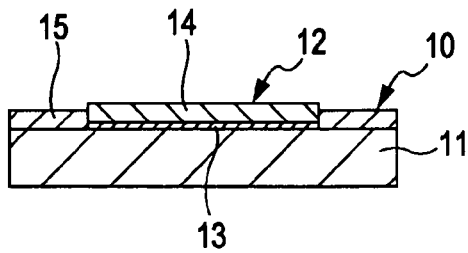
FIGS. 3A to 3H are longitudinal sectional views illustrating steps A and F in a method according to an embodiment for producing a semiconductor-chip-mounting circuit, in alphabetical order.
Figure 3B:
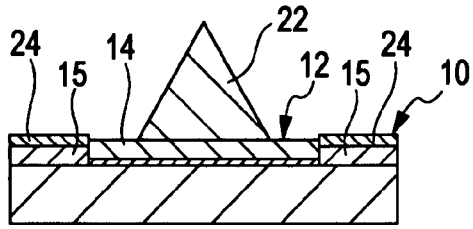
Figure 3C:
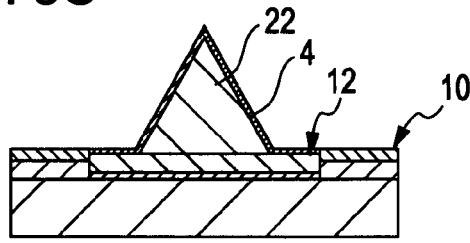
Figure 3D:
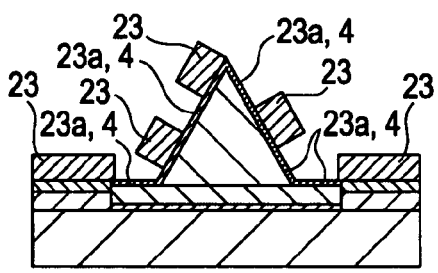
Figure 3E:
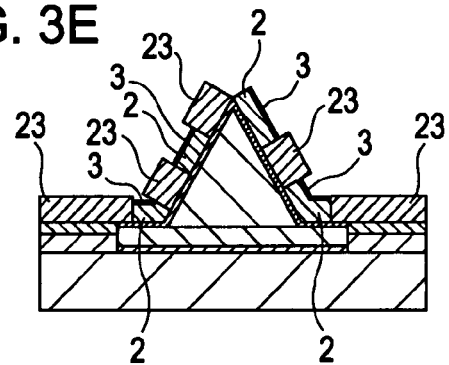
Figure 3F:
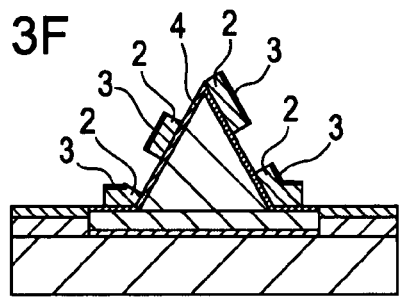
Figure 3G:
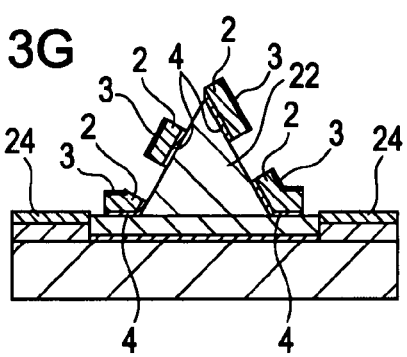
Figure 3H:
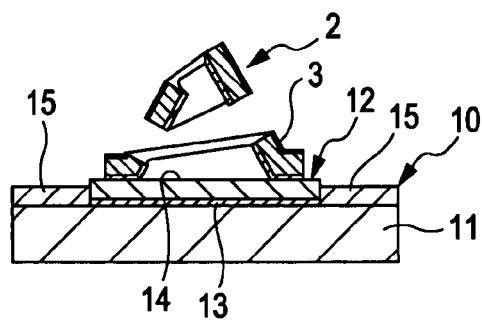

FIGS. 3A to 3H are longitudinal sectional views illustrating the step A and the substep F in alphabetical order. As shown in FIG. 3H, in the step A according to this embodiment, each contact 2 is formed in the form of a conical helix on the surface of a corresponding one of the connecting terminals 12 formed on the mounting circuit 10. Specifically, the step A according to this embodiment includes eight substeps: a substep A1 to a substep A4, the substep F, and a substep A5 to a substep A7, in that order.

In the substep A1, a resist cone 22, as shown in FIG. 3B, having a diameter smaller than the external diameter of each connecting terminal 12 is formed on a corresponding one of the connecting terminals 12 disposed on the mounting circuit 10 as shown in FIG. 3A. The resist cone 22 is formed by forming a resist column (not shown) on the surface of the connecting terminal 12 and then patterning (resist coating, multiple exposure, and development) the resist column. In addition to the resist cone 22, a resist film 24 is preferably formed so as to surround the connecting terminal. The resist cone 22 is composed of a novolac-type resist material.

As described above, each connecting terminal 12 arranged on the mounting circuit 10 includes the circular connecting terminal base 13 and the contact-assisting film 14 formed by solder-plating the surface of the connecting terminal base, as shown in FIGS. 3A and 3B. The solder resist film 15 surrounds the circular connecting terminal 12.

In the substep A2, as shown in FIG. 3C, after patterning the resist cone 22, a metal having satisfactory electrical conductivity is sputtered to form a seed film 4 on surfaces of the resist cone 22 and the connecting terminal 12. The seed film 4 has a multilayer structure including a first layer of a Ti layer or a Cr layer with a thickness of about 15 nm and a second layer of a Cu layer with a thickness of about 0.1 μm, stacked in that order.

In the substep A3, after the formation of a resist film 23 on the surface of the seed film 4, as shown in FIG. 3D, a conical helical groove 23a is formed in the resist film 23 by patterning. In the conical helical groove 23a, the apex of the resist cone 22 serves as the top of the conical helical groove 23a. The bottom circumference thereof is disposed on the surface of the seed film 4 formed on the surface of the connecting terminals 12. The seed film 4 is exposed in the conical helical groove 23a. The resist film 23 is composed of a novolac-type resist material.

In the substep A4, as shown in FIG. 3E, solder-plating the seed film 4 exposed in the conical helical groove 23a results in the formation of the contact 2 having a thickness of about 10 μm in the conical helical groove 23a. The contact 2 is composed of solder of a Sn—Ag alloy.

In the substep F, as shown in FIG. 3E, an oxidation-resistant metal is grown by plating on the surface of the contact 2 to form the antioxidant film 3. The oxidation-resistant metal is Au. The antioxidant film 3 has a thickness of about 0.3 μm. The antioxidant film 3 according to this embodiment is also formed on the surface of each of the bumps 21 formed on the semiconductor chip 20 (not shown in FIG. 3E). Any of thin-film formation techniques, such as plating, sputtering, and evaporation, may be employed as a method for producing the antioxidant film 3 on each bump 21. The step of forming the antioxidant film 3 on each bump 21 may be performed in any timing, i.e., before the step A, in the course of the step A, or after the step A, as long as the it is performed before the step B.

In the substep A5, as shown in FIG. 3F, after the formation of the contact 2, the resist film 23 is removed. N-Methyl-2-pyrrolidone (molecular formula: $C_5H_9NO$, trade name: NMP) is used as a resist remover.

In the substep A6, as shown in FIG. 3G, after the removal of the resist film 23, the seed film 4 exposed at the surface is removed. The removal of the seed film 4 is performed by ion milling.

In the substep A7, as shown in FIG. 3H, after the removal of the seed film 4, a resist remover is fed into the portion where the seed film 4 is removed, thereby removing the resist cone 22. N-Methyl-2-pyrrolidone that is also used as the resist remover for removing the resist film 23 is used as the resist remover.

Figure 4A:
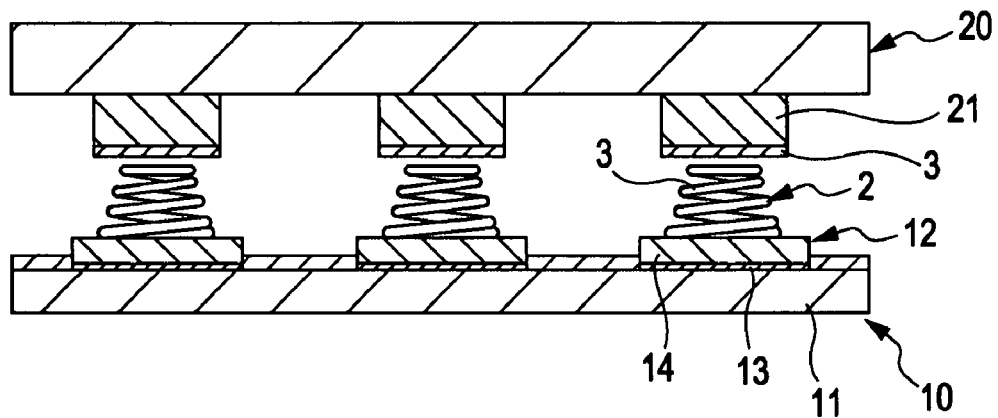
FIGS. 4A and 4B are longitudinal sectional views illustrating steps B and C in a method according to an embodiment for producing a semiconductor-chip-mounting circuit, in alphabetical order.
Figure 4B:
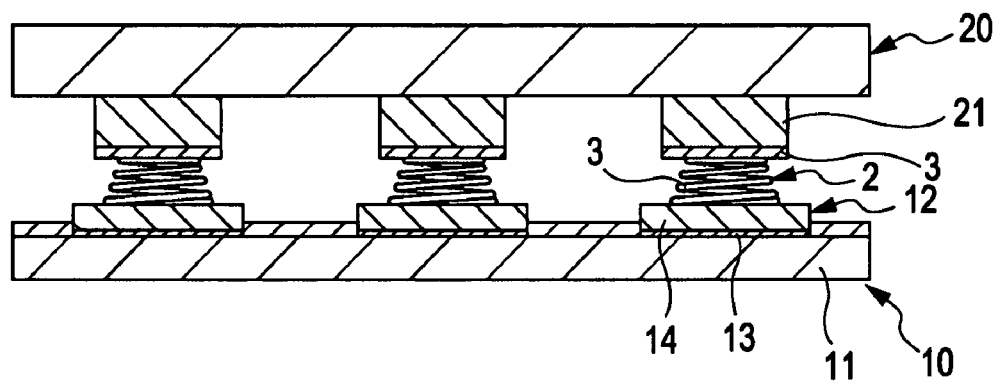

FIGS. 4A and 4B are longitudinal sectional views illustrating the step N and step C in the alphabetical order. In the step B, as shown in FIGS. 4A and 4B, the bumps 21 on the semiconductor chip 20 are pressed against the contacts 2. The contacts 2 are each in the form of a conical helix. Thus, as shown in FIG. 4B, when the contacts 2 are pressed against the bumps 21, the contraction of the contacts 2 applies an elastic force to the bumps 21.

In the step C, as shown in FIG. 4B, after pressing the bumps 21 against the contacts 2, a test voltage is applied to the interconnection pattern formed in the mounting circuit 10. Thereby, a continuity test is performed for the semiconductor chip 20 and the mounting circuit 10 while the semiconductor chip 20 is temporally mounted on the mounting circuit 10.

In the case where the continuity test demonstrates that the semiconductor chip 20 or the mounting circuit 10 operates abnormally, in the step D, the semiconductor chip 20 or the mounting circuit 10 is replaced with new one. This replacing operation can be performed by removing the force applying the bumps 21 against the contacts 2. When the semiconductor chip 20 is replaced, the step B and the step C are performed in sequence. When the mounting circuit 10 is replaced, the step A, the step B, and the step C are performed in sequence.

Figure 5:
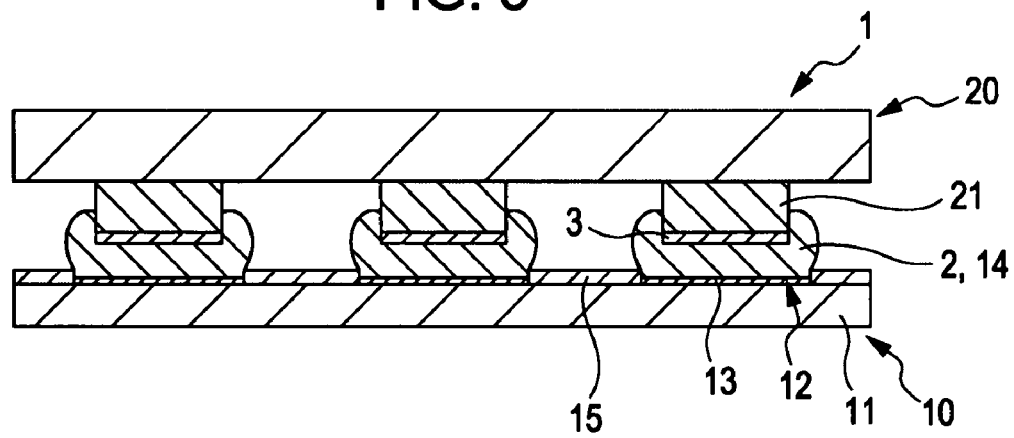
FIG. 5 is a longitudinal sectional view illustrating a step E in a method according to an embodiment for producing a semiconductor-chip-mounting circuit.

FIG. 5 is a longitudinal sectional view showing the step E. In the case where the continuity test in the step C demonstrates that the semiconductor chip 20 and the mounting circuit 10 operate normally, as shown in FIG. 5, in the step E, the contacts 2 are melted to connect the bumps 21 to the connecting terminals 12. When the contacts 2 are melted, the contact-assisting films 14 on the connecting terminals 12 are also melted. That is, solder used for the contacts 2 and the contact-assisting films 14 is used for the connection of the bumps 21 with the connecting terminals 12. By performing the step E, the semiconductor chip 20 is mounted on the mounting circuit 10 to complete the production process of the semiconductor-chip-mounting circuit 1.

Referring to FIGS. 1 to 5, advantages of the method for producing the mounting circuit 10 and the semiconductor-chip-mounting circuit 1 will be described below.

As shown in FIGS. 1 and 2, in the mounting circuit 10 according to this embodiment, the contacts 2 are formed on the surfaces of the connecting terminals 12. The contacts 2 are each in the form of a conical helix. Thus, as shown in FIGS. 4A and 4B, even when the bumps 21 and the connecting terminals 12 have different heights, by bringing the bumps 21 on the semiconductor chip 20 into contact with the contacts 2, a continuity test can be performed for the semiconductor chip 20 with the mounting circuit 10 on which a semiconductor chip will be mounted. Furthermore, the continuity test for the semiconductor chip 20 also functions as a continuity test for the mounting circuit 10. Thus, the continuity test for the semiconductor-chip-mounting circuit 1 is performed without the connection of the bumps 21 with the connecting terminals 12.

The contacts 2 according to this embodiment are composed of solder. Thus, the contacts 2 disadvantageously have characteristics in which setting occur easily due to slip deformation. However, after the continuity test in the step C, the contacts 2 are melted. Thus, the contacts 2 having slip properties that withstand the continuity test performed at most three to four times are sufficient. That is, the contacts 2 composed of solder serve sufficiently as contacts.

The antioxidant films 3 composed of Au are formed on the surfaces of the contacts 2. Thus, if a burn-in test is performed in the FIG. 4B, the formation of a non-conductive oxide film on the surfaces of the contacts 2 can be prevented. Furthermore, it is difficult to exert a large elastic force with each contact 2 because of the contacts 2 composed of solder. However, the antioxidant films 3 have satisfactory conductivity. Thus, even when the elastic force of the contacts 2 applied to the bumps 21 is small, the bumps 21 can be surely connected to the connecting terminals 12.

The solder is composed of a Sn—Ag alloy. Lead, which adversely affects the human body, is not used. Furthermore, the bondability of the Sn—Ag-alloy solder is substantially the same as that of a Sn—Pb alloy. That is, the use of the solder according to this embodiment results in the production of the mounting circuit 10 having a less effect on the human body without a degradation in bondability.

The semiconductor-chip-mounting circuit 1 according to this embodiment is formed by mounting the semiconductor chip 20 on the mounting circuit 10 according to this embodiment. As shown in FIGS. 3A to 5, the semiconductor-chip-mounting circuit 1 is produced through the steps A to E.

In the step A, the contacts 2 composed of solder and in the form of a conical helix are formed on the surfaces of the connecting terminals 12, thereby performing the continuity test for the semiconductor chip 20 and the mounting circuit 10 without the connection of the bumps 21 with the connecting terminals 12. In the step E, after the continuity test for the semiconductor chip 20 and the mounting circuit 10 shown in FIG. 4B, i.e., the continuity test for the semiconductor-chip-mounting circuit 1 before mounting, is performed, the contacts 2 and the contact-assisting films 14 are melted as shown in FIG. 5. Thus, the bumps 21 and the connecting terminals 12 are connected while maintaining the state in which the continuity test is performed.

Even in the case where the continuity test demonstrates that the semiconductor chip 20 or the mounting circuit 10 operates abnormally, by replacing either one of the two with new one, the other can be used without disposal. Thus, when one of the semiconductor chip 20 or the mounting circuit 10 is defective, the other, which is non-defective, need not be discarded, thereby minimizing loss due to disposal and industrial waste.

That is, the continuity test for the semiconductor chip 20 is performed with the mounting circuit 10 on which the semiconductor chip will be mounted. After non-defective continuity is ensured, the semiconductor chip 20 can be mounted on the mounting circuit 10, thereby reducing the number of semiconductor-chip-mounting circuits 1 that must be discarded due to defective continuity, loss due to disposal, and industrial waste.

The continuity test for the semiconductor chip 20 or the mounting circuit 10 is performed without a test jig such as a probe card, thereby eliminating an inspection step using the test jig. Therefore, the operation of attaching and detaching the test jig to and from the semiconductor chip 20 or the mounting circuit 10 can be eliminated, thereby simplifying the production process.

In the method for producing the semiconductor-chip-mounting circuit 1 according to this embodiment, before the step B of pressing the bumps 21 against the contacts 2, the antioxidant films 3 composed of Au are formed on the surfaces of the bumps 21 as well as the surfaces of the contacts 2. Even when a burn-in test is performed in the step C, the formation of non-conductive oxide film on the surfaces of the bumps 21 and the contacts 2 can be prevented. Thus, the bumps 21 are surely connected to the connecting terminals 12 even under burn-in test environment.

In the case where the continuity test in the step C demonstrates that the semiconductor chip 20 and the mounting circuit 10 operate normally, the connecting terminals 12 on the mounting circuit 10 are connected to the bumps 21. As shown in FIG. 4B, in the mounting circuit 10 according to this embodiment, the solder resist film 15 having low solder wettability surrounds each of the connecting terminals 12. Thus, as shown in FIG. 5, when the contacts 2 formed on the surfaces of the connecting terminals 12 are melted during mounting, solder does not wet the surface of the solder resist film 15 surrounding each of the connecting terminals 12 but wet only the surfaces of the connecting terminals 12. Thus, molten solder can be collected on the surfaces of the connecting terminals 12 without outflow, thereby preventing the lack of the amount of solder required for the connection of the bumps 21 with the connecting terminals 12.

As shown in FIG. 2, in the connecting terminals 12 connected to the bumps 21, the contact-assisting films 14 are formed on the surfaces of the connecting terminal bases 13. As shown in FIG. 5, the contact-assisting films 14 are simultaneously melted when the contacts 2 are melted. Thus, solder obtained by melting the contact-assisting films 14 can be used for the connection of the bumps 21 and the connecting terminals 12. The amount of solder constituting the contact-assisting films 14 depends on the thickness of each of the contact-assisting films 14. That is, controlling the thickness of each contact-assisting film 14 can prevent the lack of the amount of solder required for the connection of the bumps 21 with the connecting terminals 12.

That is, in the mounting circuit 10 according to this embodiment, the formation of the spring solder contacts 2 on the connecting terminals 12 results in the electrical connection of the bumps 21 with the connecting terminals 12 before the connection of the bumps 21 with the connecting terminals 12. Thus, the continuity test for the semiconductor chip 20 can be performed without a test jig such as a probe card, and the continuity test for the semiconductor-chip-mounting circuit 1 can also be performed before the semiconductor chip 20 is mounted.

In the method for producing the semiconductor-chip-mounting circuit 1 according to this embodiment, after the continuity test for the semiconductor-chip-mounting circuit 1 is performed, the semiconductor chip 20 is connected to the mounting circuit 10, thereby preventing the occurrence of the defective continuity of the semiconductor-chip-mounting circuit 1 after the semiconductor chip 20 is mounted on the mounting circuit 10.

The present invention is not limited to these embodiments described above. Various change may be made according to need.

Figure 6:
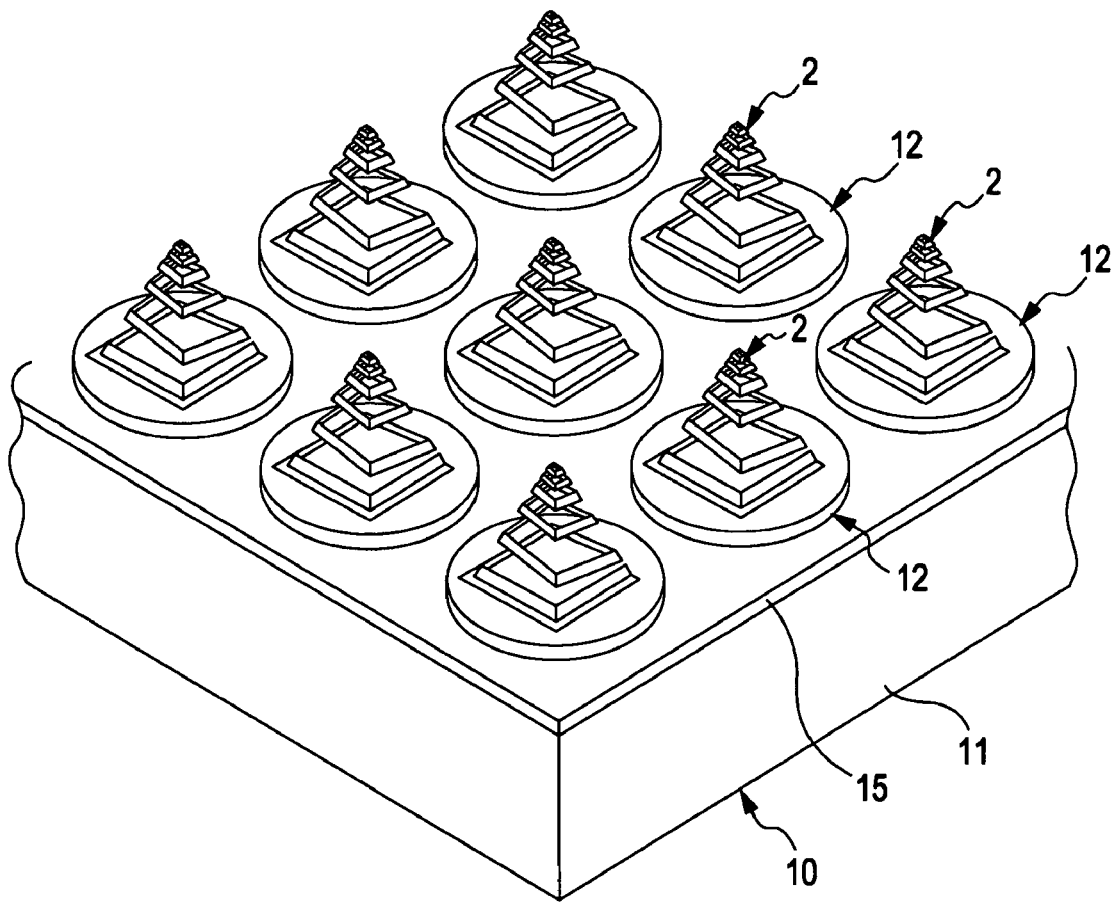
FIG. 6 is a perspective view of a mounting circuit according to another embodiment.

For example, the shape of each contact 2 according to the present invention is not limited to the conical helix. The shape may be a helix having the protruding center. As shown in FIG. 6, each of the contacts 2 according to another embodiment may be in the form of a polygonal pyramidal helix. In this case, preferably, in the substep A1, the resist cones 22 each in the form of a polygonal pyramid are formed by patterning, and then in the substep of A3, a polygonal pyramidal groove is formed in each of the resist films 23 by patterning.

What is claimed is:

1. A method for producing a semiconductor-chip-mounting circuit, the method comprising:

a step A of forming a contact on a surface of a connecting terminal disposed on a mounting circuit, the contact being composed of solder and being in the form of a conical helix or a polygonal pyramidal helix;

a step B of pressing a bump disposed on a semiconductor chip against the contact;

after pressing the bump against the contact, a step C of applying a test voltage to an interconnection pattern formed in the mounting circuit so as to perform a continuity test for the semiconductor chip and the mounting circuit;

when the continuity test in the step C demonstrates that the semiconductor chip or the mounting circuit operates abnormally, a step D of replacing the semiconductor chip or the mounting circuit with new one and either performing the step B and the subsequent steps when the semiconductor chip is replaced or performing the step A and the subsequent steps when the mounting circuit is replaced; and only when the continuity test in the step C demonstrates that the semiconductor chip and the mounting circuit operate normally, a step E of melting the contact so as to bond the bump to the connecting terminal.

2. The method for producing a semiconductor-chip-mounting circuit according to claim 1, wherein the mounting circuit includes a solder resist film surrounding the connecting terminal, the solder resist film having low solder wettability.

3. The method for producing a semiconductor-chip-mounting circuit according to claim 1, wherein the connecting terminal includes a connecting terminal base and a contact-assisting film, and wherein the contact-assisting film is formed by solder-plating a surface of the connecting terminal base.

4. The method for producing a semiconductor-chip-mounting circuit according to claim 1, the method further comprising:

before the step B, a substep F of forming antioxidant films on surfaces of the contact and the bump, each of the antioxidant films being composed of an oxidation-resistant metal.

5. The method for producing a semiconductor-chip-mounting circuit according to claim 4, wherein the antioxidant film is formed by Au-plating the surface of the contact.

6. The method for producing a semiconductor-chip-mounting circuit according to claim 1, wherein the solder is composed of a Sn—Ag alloy.

7. A mounting circuit comprising:

connecting terminals arranged on a surface of an insulating substrate and having a pitch equal to that of bumps disposed on a semiconductor chip; and contacts arranged on surfaces of the connecting terminals, each of the contacts being composed of solder and being in the form of a conical helix or a polygonal pyramidal helix.

8. The mounting circuit according to claim 7, wherein the insulating substrate includes a solder resist film disposed on a surface thereof, the solder resist film having low solder wettability and surrounding each connecting terminal.

9. The mounting circuit according to claim 7, wherein each of the connecting terminals includes a connecting terminal base and a contact-assisting film, and wherein the contact-assisting film is formed by solder-plating a surface of the connecting terminal base.

10. The mounting circuit according to claim 7, further comprising:

antioxidant films each composed of an oxidation-resistant metal and arranged on the surface of each contact.

11. The mounting circuit according to claim 10, wherein the antioxidant films are formed by Au-plating the surfaces of the contacts.

12. The mounting circuit according to claim 7, wherein the solder is composed of a Sn—Ag alloy.

* * * * *